United States Patent
Kim

(10) Patent No.: US 9,223,656 B2
(45) Date of Patent: Dec. 29, 2015

(54) OPERATING METHOD FOR MEMORY SYSTEM INCLUDING NONVOLATILE RAM AND NAND FLASH MEMORY

(71) Applicant: SAMSUNG ELECTRONICS CO., LTD., Suwon-si, Gyeonggi-do (KR)

(72) Inventor: Bogeun Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 156 days.

(21) Appl. No.: 13/960,826

(22) Filed: Aug. 7, 2013

(65) Prior Publication Data
US 2014/0047269 A1    Feb. 13, 2014

(30) Foreign Application Priority Data
Aug. 7, 2012  (KR) .................. 10-2012-0086443

(51) Int. Cl.
| | |
|---|---|
| G06F 11/00 | (2006.01) |
| G06F 11/14 | (2006.01) |
| G11C 11/56 | (2006.01) |
| G11C 16/34 | (2006.01) |
| G11C 16/00 | (2006.01) |
| G11C 29/02 | (2006.01) |
| G11C 29/04 | (2006.01) |

(52) U.S. Cl.
CPC ........ G06F 11/1402 (2013.01); G11C 11/5642 (2013.01); G11C 16/3404 (2013.01); *G11C 16/00* (2013.01); *G11C 29/021* (2013.01); *G11C 29/028* (2013.01); *G11C 2029/0409* (2013.01)

(58) Field of Classification Search
CPC .................................................. G06F 12/0246
See application file for complete search history.

(56) References Cited

U.S. PATENT DOCUMENTS

| | | | |
|---|---|---|---|
| 7,545,677 B2 | 6/2009 | Lee et al. | |
| 7,808,831 B2 | 10/2010 | Mokhlesi et al. | |
| 7,889,563 B2 | 2/2011 | Cho et al. | |
| 7,911,848 B2 | 3/2011 | Eun et al. | |
| 8,060,719 B2 | 11/2011 | Radke et al. | |
| 8,638,602 B1 * | 1/2014 | Horn ................... | 365/185.03 |
| 8,953,373 B1 * | 2/2015 | Wu et al. ............. | 365/185.03 |

(Continued)

FOREIGN PATENT DOCUMENTS

| | | |
|---|---|---|
| KR | 10-2009-0129205 A | 12/2009 |
| KR | 10-2010-0013485 A | 2/2010 |

(Continued)

OTHER PUBLICATIONS

Microsoft Computer Dictionary, Microsoft Press, 4th Ed., 1999, p. 313.*

(Continued)

*Primary Examiner* — Christopher McCarthy
(74) *Attorney, Agent, or Firm* — Volentine & Whitt, PLLC

(57) ABSTRACT

An operating method for a memory system including a nonvolatile random access memory (NVRAM) and a NAND flash memory includes performing a normal read operation directed to the target memory cell in response to a read request, determining that a read fail has occurred as a result of the normal read operation, then performing a read retry operation by iterations directed to the target memory cell according to a first read retry scheme until a pass read retry iteration successfully reads the target memory cell, and storing pass information associated with the pass read retry iteration in the NVRAM.

18 Claims, 15 Drawing Sheets

(56) References Cited

U.S. PATENT DOCUMENTS

| | | | |
|---|---|---|---|
| 2008/0244339 A1* | 10/2008 | Kong et al. | 714/704 |
| 2010/0027335 A1 | 2/2010 | Kim et al. | |
| 2010/0118608 A1 | 5/2010 | Song et al. | |
| 2010/0302850 A1* | 12/2010 | Kim et al. | 365/185.09 |
| 2011/0007563 A1 | 1/2011 | Yoo et al. | |
| 2011/0066899 A1* | 3/2011 | Kang et al. | 714/54 |
| 2012/0239991 A1* | 9/2012 | Melik-Martirosian | 714/708 |
| 2013/0185612 A1* | 7/2013 | Lee et al. | 714/773 |

FOREIGN PATENT DOCUMENTS

| | | |
|---|---|---|
| KR | 10-2010-0052159 A | 5/2010 |
| KR | 10-2010-0127406 A | 12/2010 |
| KR | 10-2011-0004100 A | 1/2011 |

OTHER PUBLICATIONS

G.S. Choi et al., "A hybrid SSD with PRAM and NAND Flash memory", Microprocessors and Microsystems, vol. 36 Issue 3, May 2012.

Gaurav Dhiman et al., "PDRAM: A Hybrid PRAM and DRAM Main Memory System", Design Automation Conference, 2009. DAC '09. 46th ACM/IEEE(Jul. 26-31, 2009).

Jin Kyu Kim et al., "A PRAM and NAND Flash Hybrid Architecture for High-Performance Embedded Storage Subsystems" EMSOFT '08 Proceedings of the 8th ACM international conference on Embedded software pp. 31-39.

Moinuddin K. Qureshi et al., "Scalable High Performance Main Memory System Using Phase-Change Memory Technology", International Symposium on Computer Architecture (ISCA) 2009.

* cited by examiner

OPERATING METHOD FOR MEMORY SYSTEM INCLUDING NONVOLATILE RAM AND NAND FLASH MEMORY

CROSS-REFERENCE TO RELATED APPLICATIONS

A claim for priority under 35 U.S.C. §119 is made to Korean Patent Application No. 10-2012-0086443 filed Aug. 7, 2012, the subject matter of which is hereby incorporated by reference.

BACKGROUND

Embodiments of the inventive concept relate to semiconductor memory systems, and more particularly, to operating methods for memory systems including both non-volatile Random Access Memory (RAM) and NAND flash memory.

Data is stored in NAND flash memory according to a number of threshold voltage distributions, each respectively associated with a given data state. That is, the memory cell transistor of a NAND flash memory cell may be "programmed" to a particular voltage level that falls within a prescribed threshold voltage distribution in view of a desired data state. There are many different programming approaches that may be used to adjust (up and/or down) a NAND flash memory cell threshold voltage. There are also many different memory cell and memory system related effects and phenomena that can undesirably change a NAND flash memory cell threshold voltage. When the programmed threshold voltage of a NAND flash memory cell changes beyond the bounds of a prescribed threshold voltage distribution, a read error (or "read fail") may arise during a subsequent read operation.

In response to a read fail, many contemporary memory systems will execute a so-called "read retry operation". During a read retry operation, a NAND flash memory cell may be iteratively read using different (e.g., variably-adjusted) read voltages. Read retry operations often resolve read fails, but require a significant amount of time. Thus, while read retry operations facilitate data accuracy they tend to reduce memory system operating efficiency.

SUMMARY

In one embodiment, the inventive concept provides an operating method for a memory system including a nonvolatile random access memory (NVRAM) and a NAND flash memory, the method comprising; receiving a read request directed to a target memory cell of the NAND flash memory, performing a normal read operation directed to the target memory cell in response to the read request, and then, determining that a read fail has occurred as a result of the normal read operation; and then in response to the read fail, performing a read retry operation by iterations directed to the target memory cell according to a first read retry scheme until a pass read retry iteration successfully reads the target memory cell, and then, storing pass information associated with the pass read retry iteration in the NVRAM.

In another embodiment, the inventive concept provides an operating method for a memory system including a nonvolatile random access memory (NVRAM) and a NAND flash memory, the method comprising; receiving a read request directed to a target memory cell of the NAND flash memory, determining whether a number of program/erase (P/E) cycles for the target memory cell has reached a reference value, and (A) upon determining that the number of P/E cycles for the target memory cell has not reached the reference value, performing a normal read operation directed to the target memory cell; else (B) upon determining that the number of P/E cycles for the target memory cell has reached the reference value, reading pass information related to the read request previously stored in the NVRAM, and performing a read retry operation by iterations directed to the target memory cell according to a first read retry scheme until a pass read retry iteration successfully reads the target memory cell, wherein the first read retry scheme is defined at least in part by the pass information read from the NVRAM, and then, determining that a read fail has occurred as a result of the normal read operation; and then in response to the read fail, performing the read retry operation by iterations directed to the target memory cell according to the first read retry scheme until the pass read retry iteration successfully reads the target memory cell, and then, storing updated pass information associated with the pass read retry iteration in the NVRAM.

In another embodiment, the inventive concept provides an operating method for a memory system including a nonvolatile random access memory (NVRAM) and a NAND flash memory, the method comprising; receiving a read request directed to a target memory cell of the NAND flash memory, performing a normal read operation directed to the target memory cell in response to the read request, and then, determining that a read fail has occurred as a result of the normal read operation; and then in response to the read fail, iteratively performing an read operation using different read voltages to obtain pass information, making a soft decision regarding the programmed state of the target memory cell in relation to the pass information, and storing the pass information in the NVRAM.

DETAILED DESCRIPTION

Figure 1:
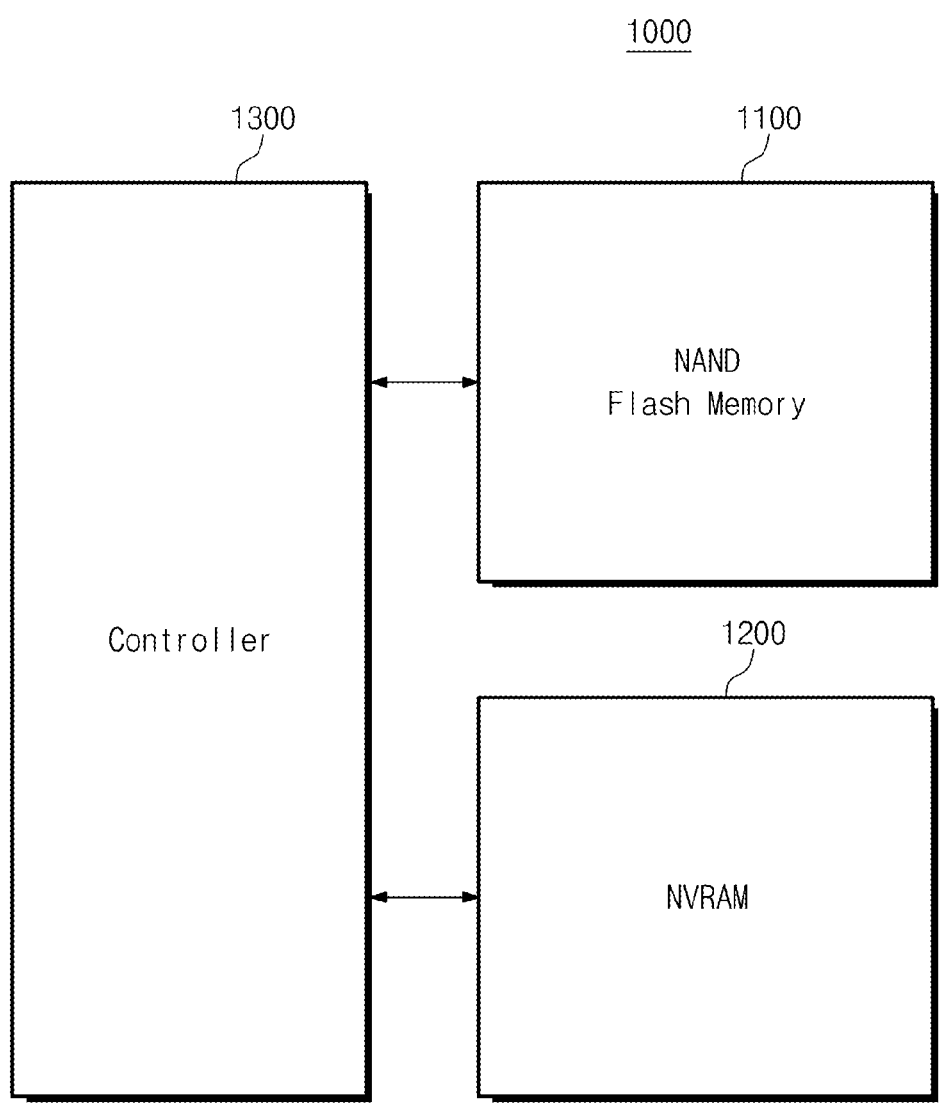
FIG. 1 is a block diagram illustrating a memory system according to an embodiment of the inventive concept.

Embodiments of the inventive concept will now be described in some additional detail with reference to the accompanying drawings. The inventive concept, however, may be embodied in various different forms, and should not be construed as being limited to only the illustrated embodiments. Rather, the illustrated embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numbers and labels denote like or similar elements throughout the drawings and written description.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a memory system according to an embodiment of the inventive concept. Referring to FIG. 1, a memory system 1000 generally comprises a NAND flash memory 1100, a NonVolatile Random Access Memory (NVRAM) 1200, and a controller 1300.

The NAND flash memory 1100 may perform program, read, and erase operations according to the control of the controller 1300. The NAND flash memory 1100 may store one or more bits per memory cell.

The NAND flash memory 1100 will have different operating characteristics as compared with the NVRAM 1200. For example, the NAND flash memory 1100 may require an erase-before-write during the programming of data. That is, the memory cells of the NAND flash memory 1100 must first be erased prior to programming. Further, the NAND flash memory 1100 may use different unit data sizes for program and read operations as compared with the erase operation.

For example, the NAND flash memory 1100 may perform program and read operations according to a page unit, wherein a page may be defined as the memory cells connected with a word line (or word line portion) within the NAND flash memory 1100. Alternately, when memory cells of the NAND flash memory 1100 are arranged to have a three-dimensional structure, memory cells arranged along rows and columns may be connected in common to a word line. With this configuration, a page for a program/read unit may be formed of memory cells, arranged in a row or column from among memory cells connected in common to a word line. Memory cells in a program or read unit are usually programmed or read at the same time.

In contrast, an erase unit of the NAND flash memory 1100 may be a memory block. The memory block may include memory cells connected with a plurality of word lines. That is, a size of the memory block being an erase unit may be larger than a size of a page being a program or read unit.

The NVRAM 1200 may also perform program, read, and erase operations under the control of the controller 1300. The NVRAM 1200 maybe used to store a single bit or multiple bits per memory cell. Instead of requiring an erase-before-write set of operations, the NVRAM 1200 may support a direct overwrite operation. Before memory cells connected to a word line are erased, the NVRAM 1200 may divide the memory cells into a plurality of groups in order to independently program each one of the plurality of groups. That is, the NVRAM 1200 may provide a so-called number of program (NOP).

In certain embodiments of the inventive concept, the NVRAM 1200 may be implemented using a phase-change RAM (PRAM), a magnetic RAM (MRAM), or a resistive RAM (ReRAM).

The controller 1300 may be configured to control the NAND flash memory 1100 and the NVRAM 1200. With the above-described characteristic of the NAND flash memory 1100, a physical address system of the NAND flash memory 1100 may be different from a logical address system of a host. The controller 1300 may provide translation between a logical address system of the host and a physical address system of the NAND flash memory 1100.

The controller 1300 may control erasing of the NAND flash memory 1100. The controller 1300 may process data erased at a host level as invalid data. At an idle state, the controller 1300 may provide a programmable memory block by erasing a memory block in which the invalid data is stored.

The controller 1300 may store user data at the NAND flash memory 1100 and metadata at the NVRAM 1200. The metadata may include information required to manage the memory system 1000. The NAND flash memory 1100 may be recognized as a storage space at an external host side. The NVRAM 1200 may not be recognized as a storage space at an external host side.

Figure 2:
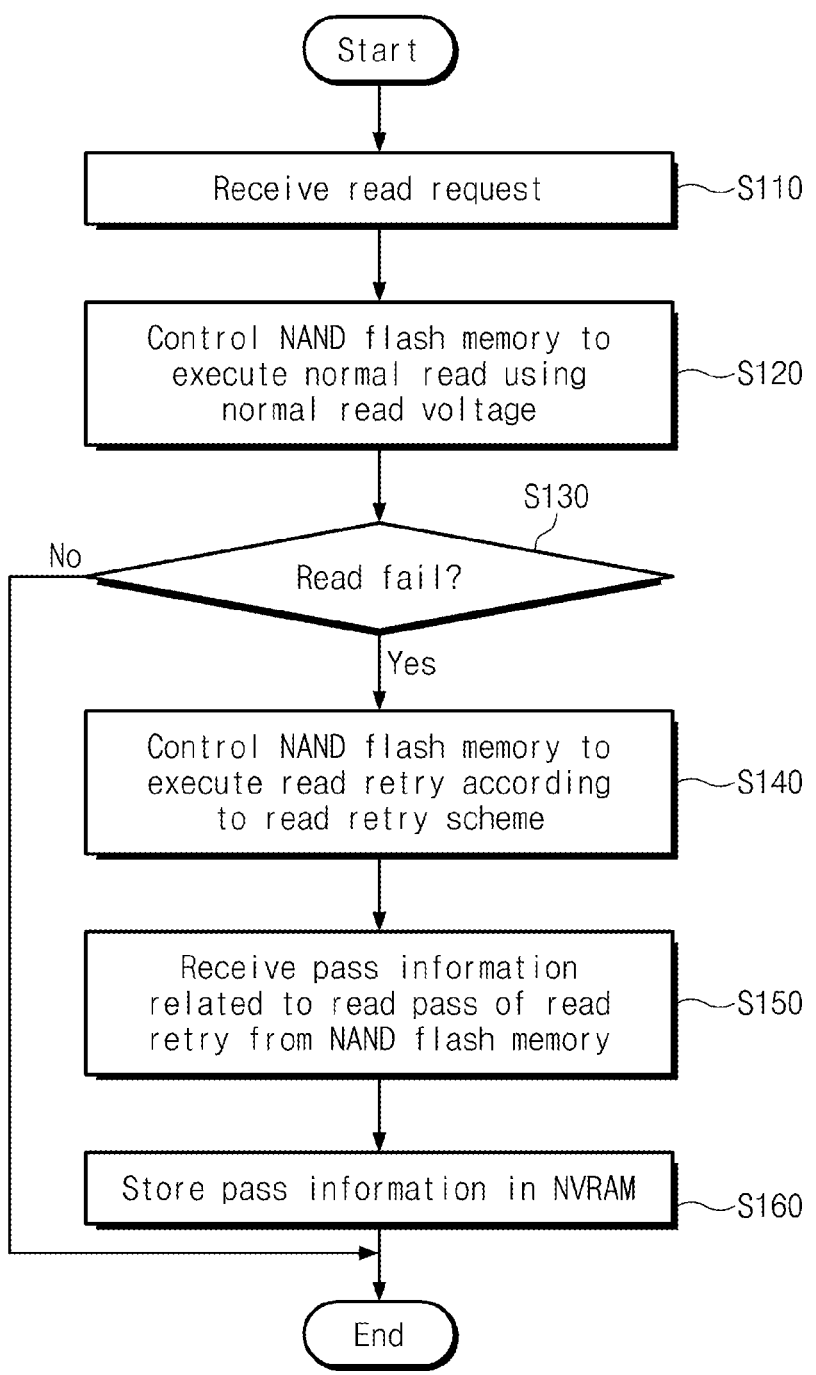
FIG. 2 is a flowchart illustrating one possible operating method for a memory system according to an embodiment of the inventive concept.

FIG. 2 is a flowchart summarizing one possible operating method for a memory system according to an embodiment of the inventive concept. It is assumed for purposes of explanation that the illustrated method of FIG. 2 may be executed using the memory system 1000 of FIG. 1 to read data stored in the NAND flash memory 1100.

It should be noted at this point that multiple exemplary method embodiments will be described hereafter in relation to FIGS. 2, 4, 5, 6, 7 and 8. Many of these embodiments while independently presented may be accomplished through the execution of like or similar method steps (e.g., function(s), operation(s), and/or process(es)). To improve clarity of description, like method steps are denoted in respective embodiments using analogous reference numbers (e.g., S160, S260, S360, S460, etc.). To avoid undue repetition of description and unless otherwise noted analogous method steps may be similarly executed and controlled.

Referring now to FIGS. 1 and 2, the operating method begins upon receipt of a read request (S110). For example, the controller 1300 may receive from an external host a read request and corresponding address directed to memory cells of the NAND flash memory 1100.

In response to the read request, the controller 1300 may control the NAND flash memory 1100 to perform a "normal" read operation using a "normal read voltage" (S120). A normal read operation is a read operation usually prescribed under nominal memory system operating conditions to determine (or "read") the programmed state of one or more memory cells of the NAND flash memory 1100. Ideally, the normal read operation will be sufficient to accurately determine the programmed state of the memory cell(s) in relation to established threshold voltage distributions. However, as noted above, the normal read operation may fail due to changes in the threshold voltage of one or more memory cells.

Hence, a determination is made as to whether a read fail has occurred (S130). If the normal read operation has not failed and a definitive programmed state for the memory cell(s) can be determined, the operating method illustrated in FIG. 2 ends. However, if the normal read operation fails, the operating method proceeds through a read retry sequence of operations (e.g., S140 through S160) in the illustrated example of FIG. 2.

Thus, the controller 1300 first controls the NAND flash memory 1100 to perform a read retry operation that may be conventionally specified by a given read retry scheme (S140). Read retry schemes usually include a plurality of steps or iterations. Thus, the NAND flash memory 1100 may perform the specified read retry operation sequentially through a number of iterations or steps. If a first read retry iteration fails, a second read retry iteration will be executed, and so on until a successful outcome is achieved. This successful outcome is commonly referred to as a "pass" or "read pass" result. As will be appreciated by those skilled in the art, each successively executed read retry iteration may apply a corresponding set of control signals having defined voltage(s) and/or current(s), prescribed control signal timing, etc. Collectively or in selected portion, the information defining the successful read retry iteration (i.e., the control signal conditions resulting in the pass result) may be referred to as "pass information".

Following the execution of an ultimately successful read retry operation, the controller 1300 will receive the corresponding pass information related to the read pass from the NAND flash memory 1100 (S150). Then, the received pass information will be stored by the controller 1300 in the NVRAM 1200 (S160).

Table 1 below illustrates exemplary pass information that may be derived and stored according to the operating method of FIG. 2.

TABLE 1

| Read retry scheme | First order | Second order |
| --- | --- | --- |
| Read Retry | 1 | 1 |
| Read Retry with history read level | 2 | 2 |

TABLE 1-continued

| Read retry scheme | First order | Second order |
| --- | --- | --- |
| Read Retry with Pre-Defined Table (PDT) | 3 | 4 |
| Monitoring cell search | 4 | |
| Minimum error search | 5 | 5 |
| Read Level Swing | 6 | 6 |
| Last Sector Count of One/Read Voltage Tracking Loop (LSCO/RVTL) | | 3 |

Those skilled in the art will understand that many different control signal settings, control signal timing requirements, as well as read retry operation variables and features may be included in pass information. For example, successive read retry iterations may be performed using a given "normal read voltage". A "history read level" may track read retry iterations that have previously resulted in read pass results. A pre-defined table or PDT may include level data for one or more control voltages (e.g., a variable read voltage). In certain embodiments, the PDT may include information about read voltage levels determined according to data obtained by predicting distortion of a threshold voltage distribution.

A monitoring cell search function is an operation wherein distortion of a threshold voltage distribution is determined according to read results of special "monitor cells" as a read voltage is adjusted over a defined range. Such monitor cells are conventionally provided within the memory cell array of the NAND flash memory 1100. Monitor cells have the same fabricated structure as the regular memory cells similarly located in the memory cell array and may therefore be used to characterize programming results for the regular memory cells.

A minimum error search function may repeatedly read memory cells using read voltages equally spaced across a threshold voltage discrimination minima valley (refer to FIG. 3) in order to ascertain an optimized read voltage associated with a minimum of read fails.

A read level swing function reads memory cells using read voltages proximate a read voltage previously determined to be an optimal.

A Last Sector Count of One/Read Voltage Tracking Loop (LSCO/RVTL) function may be used to measure threshold voltage distribution distortion according to results obtained by comparing a number of read data bits having a value of '1' with a reference value in order to determine a read voltage level according to the measured result. The reference value may be programmed at memory cells with data. The reference value may include information about a prediction value of data read to be '1' at a read operation.

As illustrated in Table 1, a given read retry scheme may sequentially perform a particular set of functions such as those noted above as possible examples. Other functions and related data may be similarly used to best characterize a read retry operation and constituent iterations.

Figure 3:
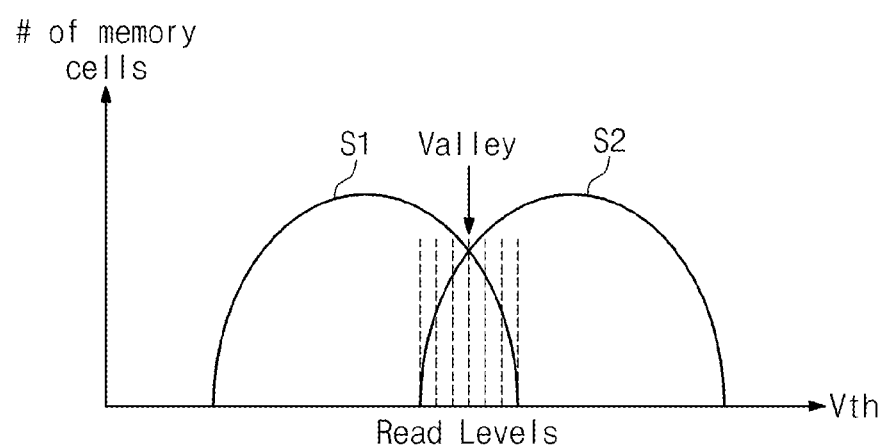
FIG. 3 is a graph illustrating a general read retry operation and corresponding pass information.

FIG. 3 is a graph illustrating a read retry operation and the development of corresponding pass information. Referring to FIG. 3, the horizontal axis indicates the threshold voltages of memory cells in the NAND flash memory 1100, and the vertical axis indicates the number of memory cells of the NAND flash memory 1100.

A first programmed state S1 is indicated by a first threshold voltage distribution for memory cells. A second state S2 is similarly indicated by a second threshold voltage distribution adjacent to the first threshold voltage distribution. Unfortunately, due to certain effects and conditions of the memory system and/or NAND flash memory 1100 some of the threshold voltages of the second (or first) threshold voltage distribution have drifted into the adjacent threshold voltage distribution range. This will usually result in read fails for flash memory cells having such errant threshold voltages.

Of note, the point at which the adjacent threshold voltage distribution curves cross may be referred to as a minima valley.

Certain read retry operations may include a function that repeatedly reads adjacent states S1 and S2 using a range of read voltages (e.g., minimum error search). The minima valley may be detected by performing read operations using the plurality of different read voltages. Read operation may be performed using different read voltages on the basis of the detected valley (e.g., read level swing) to detect an optimum read level.

Pass information may include information about the level of read voltage(s) used during a read retry operation that result in a read pass. Pass information may include information about one or more read retry iterations that result in a read pass. Pass information may include information about read voltage(s) that indicate a minima valley. Pass information may include bit error rate data derived across a minima valley. Pass program/erase cycle information for memory cells of the NAND flash memory 1100 correlated to read operation success. Pass information may include bit error rates respectively corresponding to read operations performed using different read voltages. Pass information may be managed on a memory block basis for the NAND flash memory 1100. Pass information may be managed on a page basis for the NAND flash memory 1100.

Figure 4:
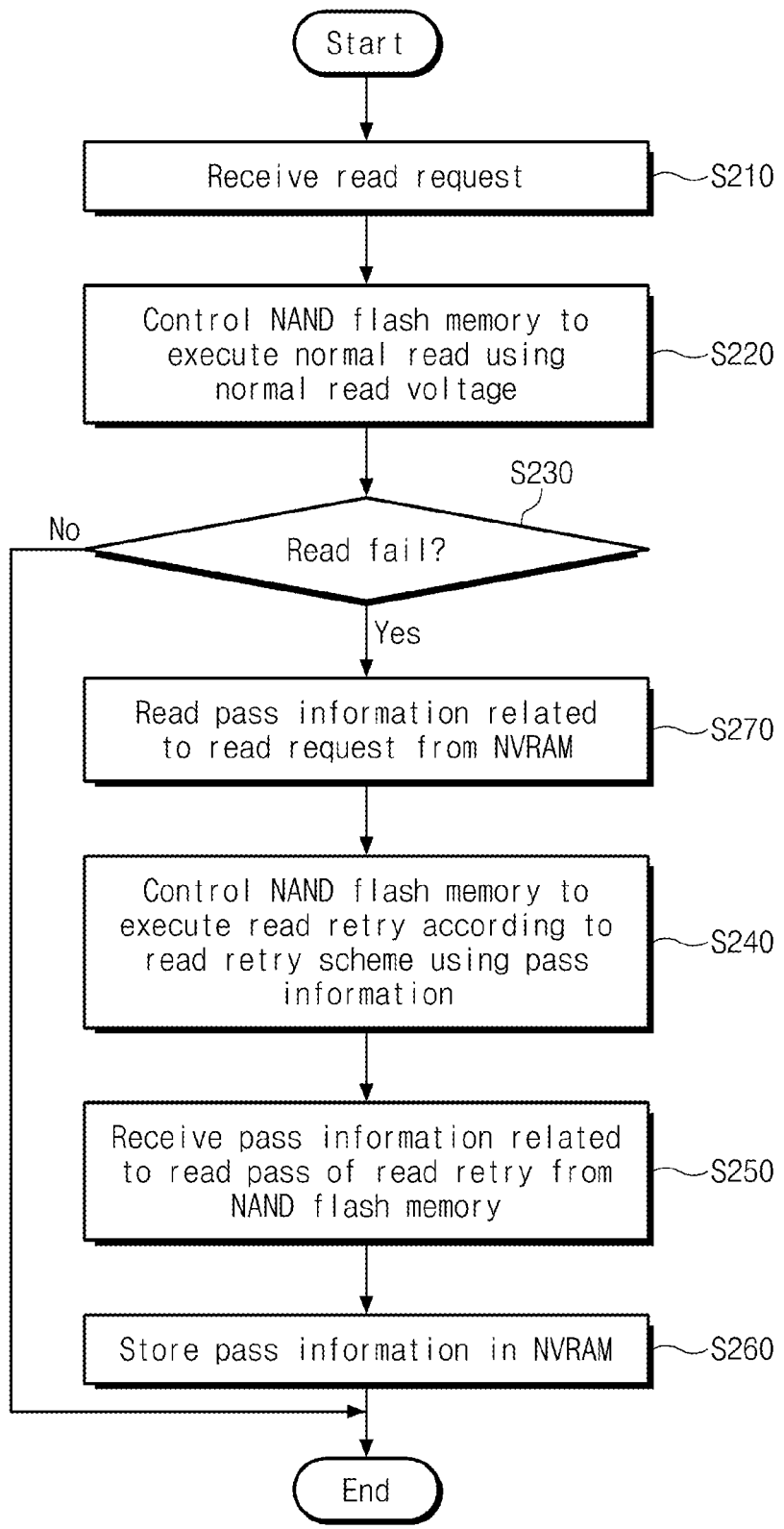
FIGS. 4, 5, 6, 7 and 8 are respective flowcharts, each illustrating a possible operating method for a memory system according to certain embodiments of the inventive concept.

FIG. 4 is a flowchart summarizing another operating method for a memory system according to an embodiment of the inventive concept. The operating method illustrated in FIG. 4 may be executed using the memory system 1000 of FIG. 1. The operating method of FIG. 4 is analogous to the method of FIG. 2, except for the additional step of reading pass information previously stored in the NVRAM 1200 (S270) prior to controlling the NAND flash memory 1100 to execute a read retry operation (S240). Thus, the read retry operation need not be a default read retry operation but may be a read retry operation having a scheme positively informed (or optimized) by previously derived pass information. In this manner, the time required to reach a successful read retry iteration may be markedly reduced.

As a result, for example, the controller 1300 may determine whether a read pass occurs (or should occur) at a particular read retry iteration (a "pass read retry iteration") based on the existing pass information. The controller 1300 may then control the NAND flash memory 1300 to execute the read retry operation beginning at the pass read retry iteration, or beginning at an iteration closely proximate to (before and/or after) the pass read retry iteration. In this manner, the controller 1300 may detect variations in read voltage correlation to read pass results, and accordingly define the stored pass information. At some point in this iterative process, the controller 1300 may determine a new read voltage level is mandated due to a detected variation tendency in threshold voltages.

As will be appreciated from the former description, the controller 1300 may detect variation tendencies for read voltage level(s) in relation to a determined (or newly determined) minima valley, and/or an evolving history of read voltage levels. The controller 1300 may detect a program/erase cycle of memory cells to be read. The controller 1300 may detect pass information of memory cells, having a program/erase cycle similar to the detected program/erase cycle, from among other memory cells. The controller 1300 may control the NAND flash memory 1100 to perform the read retry operation according to the detected pass information.

The controller 1300 may detect a variation tendency of a bit error rate based on a history of a bit error rate. The controller 1300 may select a start step of the read retry scheme or a reclaim (or, refresh) operation based on the detected variation tendency.

In the illustrated embodiments, the controller 1300 may extract one or more variation tendencies based on the pass information stored in the NVRAM 1200. When pass information is read, the controller 1300 may read variation tendencies at the same time to use the read variation tendencies. For example, the controller 1300 may extract and store a variation tendencies in a manner where pass information is accumulated and summed, and may store pass information detected during a previous read operation in the NVRAM 1200.

In all of the above, it should be noted that the time required for the controller 1300 to read data stored in the NVRAM 1200 will be less than the time required by the controller 1300 to read data stored in the NAND flash memory 1100. For example, the time required for the controller 1300 to read data from the NAND flash memory 1100 may be about 100 microseconds, while the time required for the controller 1300 to read data from the NVRAM 1200 may be about 60 nanoseconds. Thus, although reading data from the NVRAM 1200 is additionally performed by embodiments of the inventive concept, the overall time required to perform a read retry operation will be reduced. Thus, it is possible to improve the operating speed of the memory system 1000.

Figure 5:
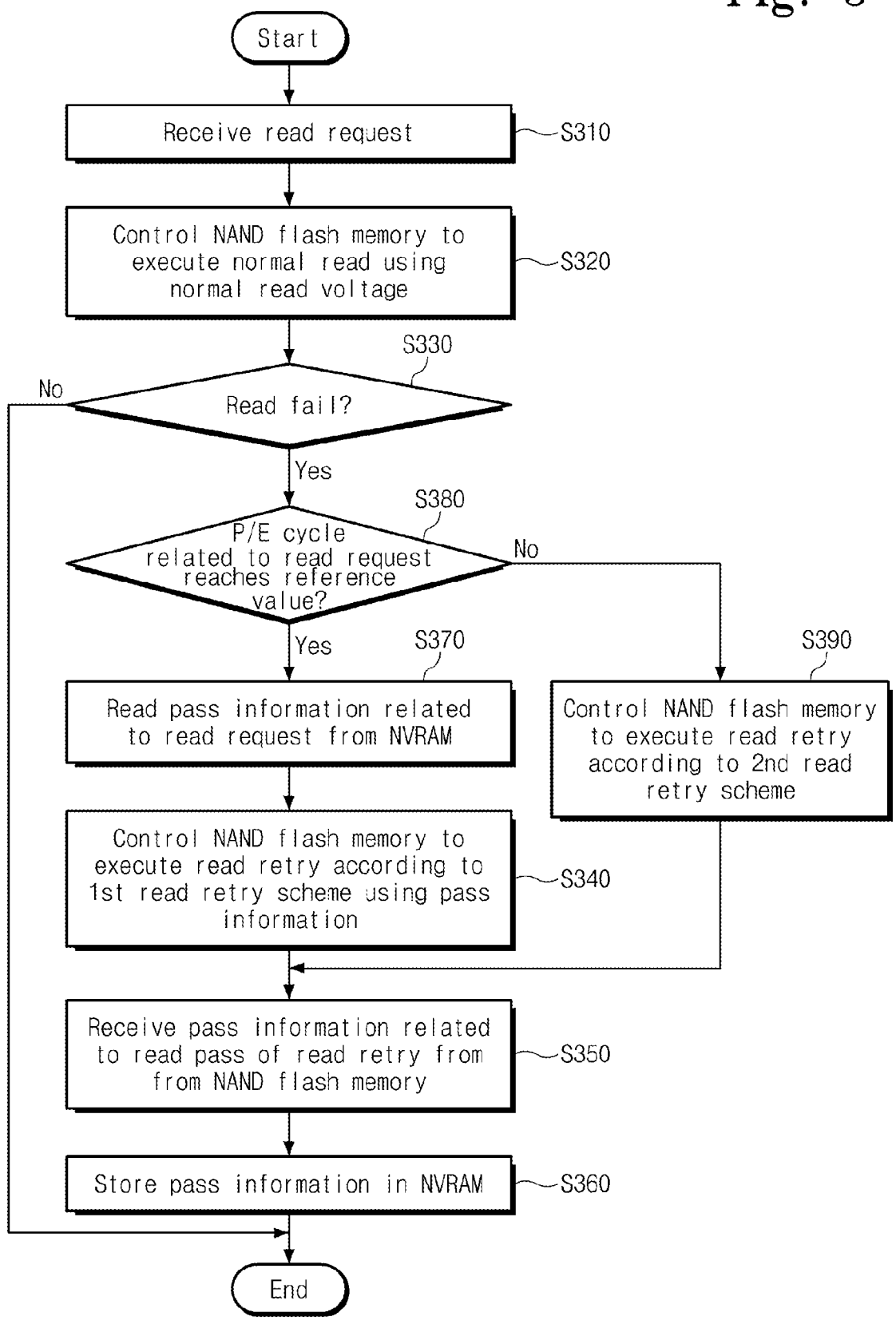

FIG. 5 is a flowchart summarizing another operating method for a memory system according to an embodiment of the inventive concept. The operating method illustrated in FIG. 5 may be executed using the memory system 1000 of FIG. 1. The operating method of FIG. 5 is analogous to the method of FIG. 4, except for the additional step of testing whether the program/erase (P/E) cycles for memory cells of the NAND flash memory 1100 identified by the read request have reached a reference value (S380). This method step is performed prior to reading pass information related to the read request from the NVRAM 1200 (S370).

If the P/E cycles for the memory cells of the NAND flash memory 1100 identified by the read request have reached the reference value (S380=Yes), then the illustrated operating method of FIG. 5 proceeds through read retry operation described in relation to FIG. 4, wherein the read retry scheme defined by the previously stored pass information is terms "first read retry scheme" (S340). However, if the P/E cycles for the memory cells of the NAND flash memory 1100 identified by the read request have not reached the reference value (S380=No), then the illustrated operating method of FIG. 5 executes the step of controlling the NAND flash memory 1100 to execute the read retry operation according to a second read retry scheme different from the first read retry scheme (S390) instead of executing method steps (S380) and (S370).

Thus, the nature of the read retry scheme defining the read retry operation may be further conditioned by not only on the nature of the pass information previously derived, but also by the number of P/E cycles (or level of NAND flash memory cell fatigue) the target memory cells have experienced. This approach further optimizes the read retry operation to current memory system operating conditions.

Figure 6:
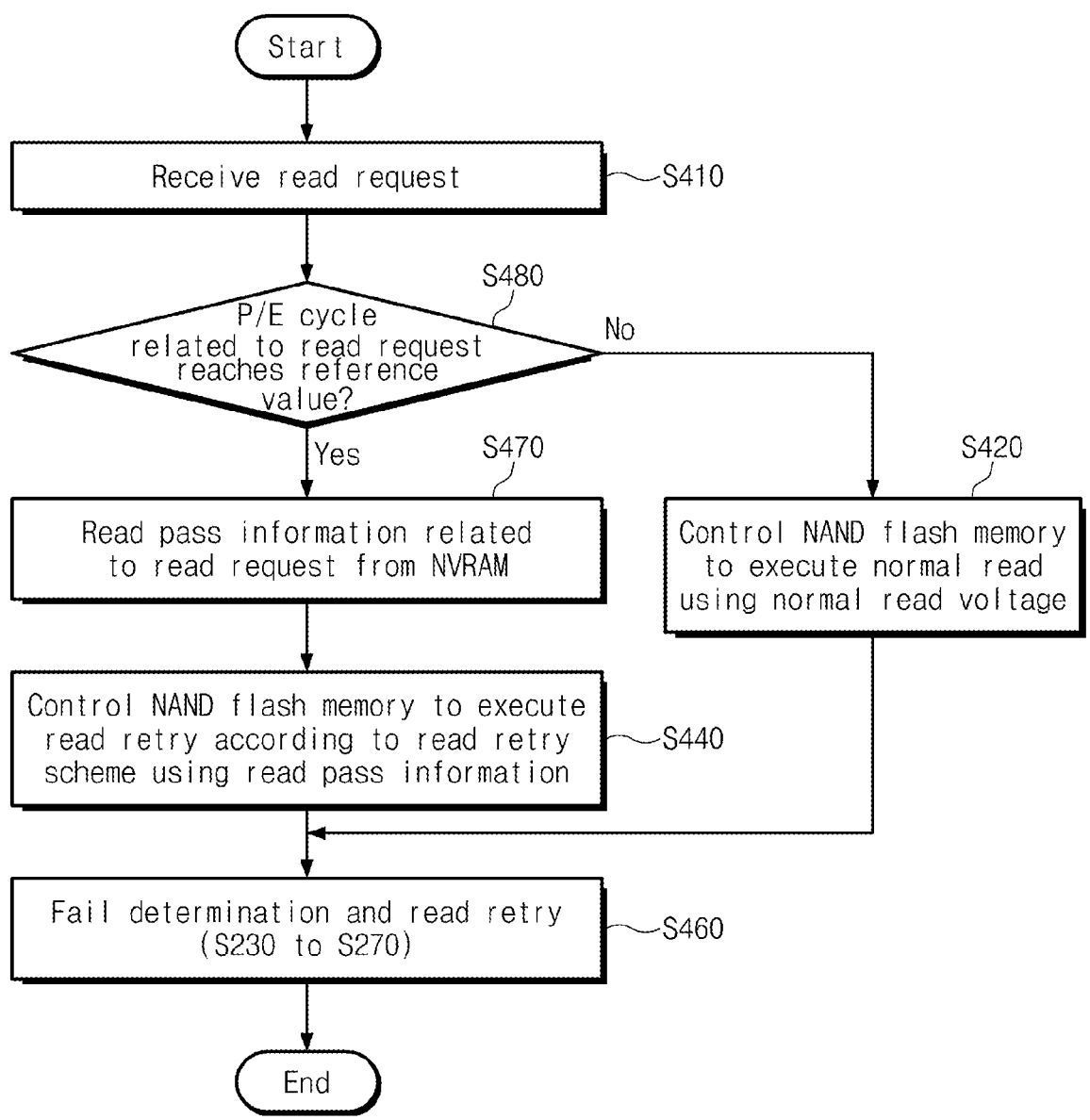

If FIG. 6 is a flow chart illustrating an operating method of a memory system according to still another embodiment of the inventive concept. In example embodiments, in FIG. 6, there may be illustrated a method where a memory system 1000 reads data stored at a NAND flash memory 1100 after pass information is accumulated at a nonvolatile random access memory 1200.

Referring to FIGS. 1 and 6, in operation S410, a read request may be received. A controller 1300 may receive a read command and an address from an external host.

In operation S420, the controller 1300 may determine whether a program/erase cycle related to the read request reaches a reference value. For example, the controller 1300 may determine whether a program/erase cycle corresponding to the received address is over the reference value.

If a program/erase cycle corresponding to the received address is over the reference value, in operation S430, the controller 1300 may read pass information associated with the read request from the nonvolatile random access memory 1200. In operation S450, the controller 1300 may control the NAND flash memory 1100 to perform a read operation using the read pass information. For example, the controller 1300 may adjust a level of a normal read voltage based on the pass information. The controller 1300 may control the NAND flash memory 1100 to perform a normal read operation using the adjusted normal read voltage.

If a program/erase cycle does not reach the reference value, in operation S440, the controller 1300 may control the NAND flash memory 1100 to perform the normal read operation using a normal read voltage.

Afterwards, in operation S460, like operations S230 to S270 of FIG. 4, read fail may be determined, and a read retry operation may be performed according to the determination result.

In example embodiments, if a program/erase cycle reaches a reference value, a level of a normal read voltage used at a normal read operation may be adjusted according to pass information. That is, if pass information associated with memory cells to be read may be sufficiently accumulated, a normal read operation may be performed using the accumulated pass information. Thus, an accurate level of a normal read operation may be further improved.

Figure 7:
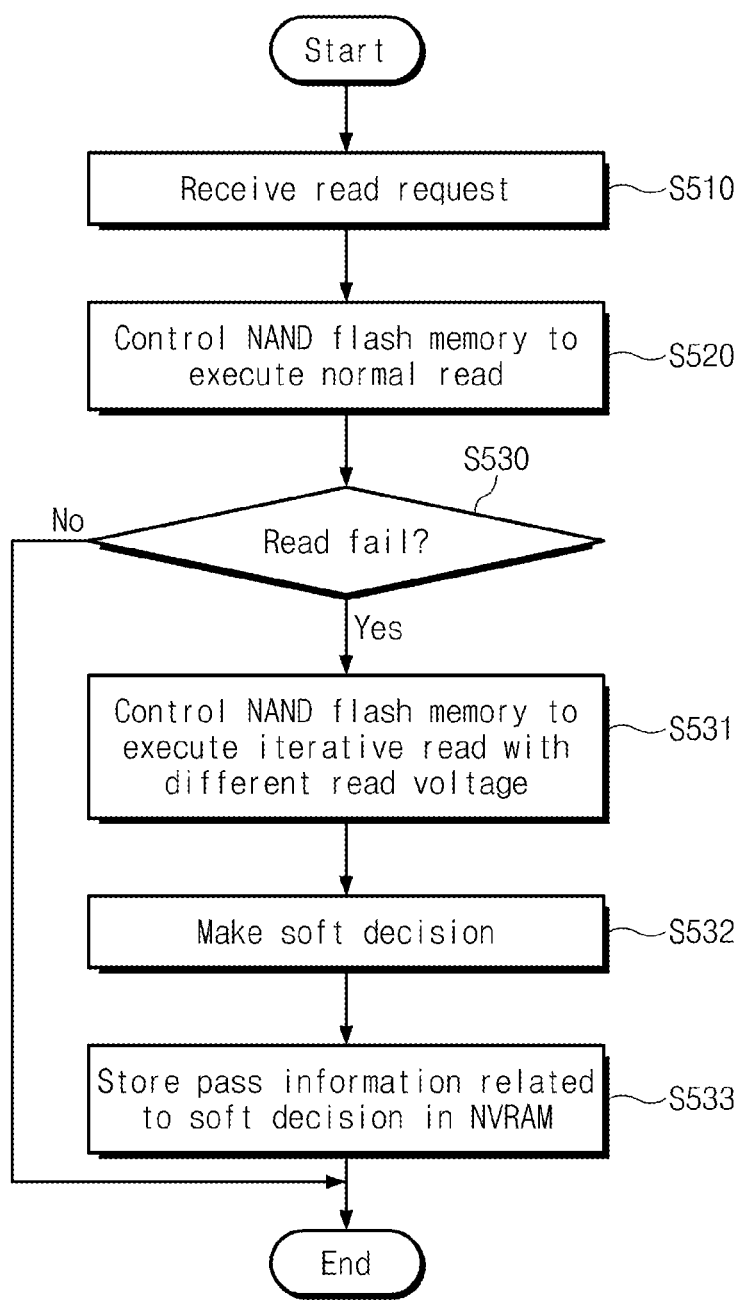

FIG. 7 is a flowchart summarizing an operating method for a memory system according to still another embodiment of the inventive concept. Referring to FIGS. 1 and 7, a read request is again received (S510). Then, the controller 1300 controls the NAND flash memory 1100 to perform a normal read operation using a normal read voltage (S520). Then, a read fail determination is made (S530).

Upon detecting a read fail (S530=Yes), the controller 1300 controls the NAND flash memory 1100 to iteratively perform a read operation using different read voltages (S531). For example, as described with reference to FIG. 3, the controller 1300 may control the NAND flash memory 1100 to perform iterative read operations using different read voltages associated with the detection of a minima valley. Using data derived from the iterative read operation executions, the controller 1300 may make a soft decision (S532). Then, the controller 1300 may store pass information associated with the soft decision in the NVRAM 1200 (S533)

Figure 8:
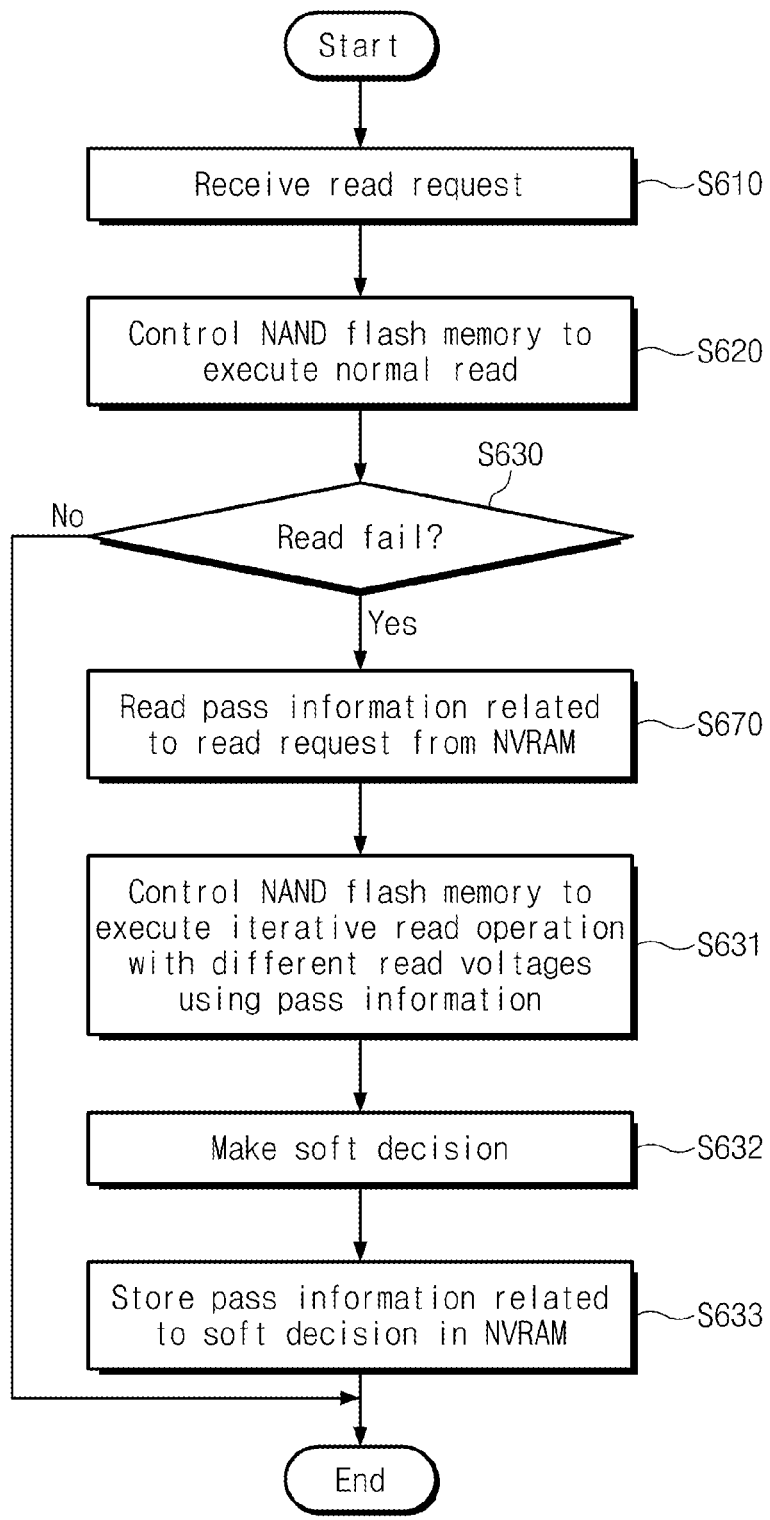

FIG. 8 is a flowchart summarizing an operating method of a memory system according to still another embodiment of the inventive concept. The method of FIG. 8 is analogous to the method of FIG. 7, except the iterative testing using repeated applications of the read operation using different read voltages (S631) is first informed by reading of stored pass information related to the read request (S670).

Figure 9:
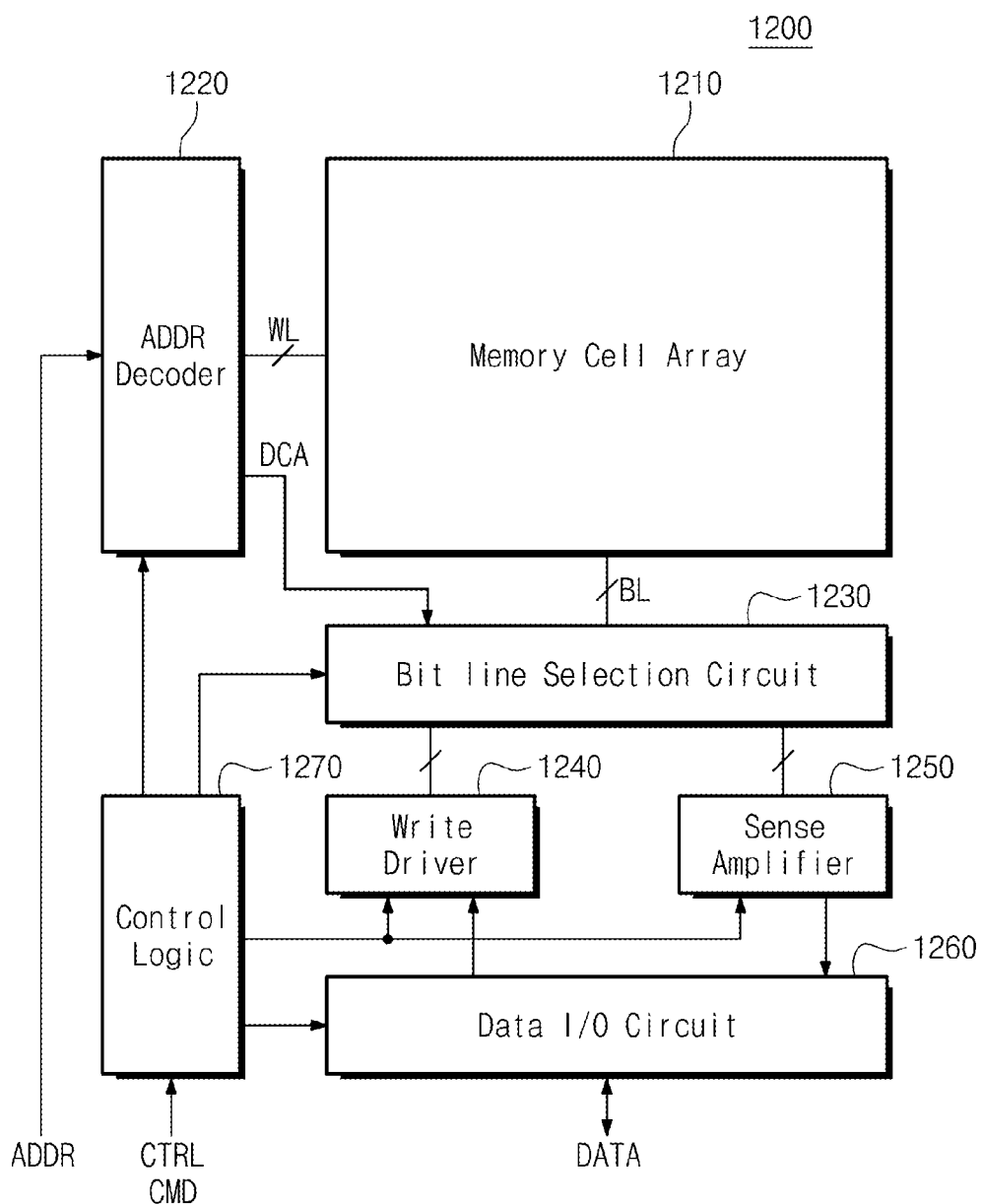
FIG. 9 is a block diagram illustrating a nonvolatile random access memory according to an embodiment of the inventive concept.

FIG. 9 is a block diagram further illustrating in one example the nonvolatile random access memory (NVRAM) 1200 according to an embodiment of the inventive concept. Referring to FIG. 9, the NVRAM 1200 comprises a memory cell array 1210, an address decoder 1220, a bit line selection circuit 1230, a write driver 1240, a sense amplifier 1250, a data input/output (I/O) circuit 1260, and control logic 1270.

The memory cell array 1210 may be connected to the address decoder 1220 via word lines WL and to the bit line selection circuit 1230 via bit lines BL. The memory cell array 1210 may include a plurality of memory cells. In example embodiments, memory cells arranged in a row direction may be connected to the word lines WL, and memory cells arranged in a column direction may be connected to the bit lines BL. In example embodiments, the memory cells of the memory cell array 1210 may store one or more bits of data, respectively.

The address decoder 1220 may be connected to the memory cell array 1210 via the word lines WL. The address decoder 1220 may be configured to operate responsive to the control of the control logic 1270. The address decoder 1220 may receive an address ADDR from an external device.

The address decoder 1220 may be configured to decode a row address of the input address ADDR. Using the decoded row address, the address decoder 1220 may select the word lines WL. The address decoder 1220 may be configured to decode a column address of the input address ADDR. The decoded column address DCA may be provided to the bit line selection circuit 1230. In example embodiments, the address decoder 1220 may include constituent elements such as a row decoder, a column decoder, an address buffer, and the like.

The bit line selection circuit 1230 may be connected to the memory cell array 1210 through the bit lines BL and to the write driver 1240 and the sense amplifier 1250. The bit line selection circuit 1230 may operate responsive to the control of the control logic 1270. The bit line selection circuit 1230 may be configured to receive the decoded column address DCA from the address decoder 1220. Using the decoded column address DCA, the bit line selection circuit 1230 may select the bit lines BL.

At a program operation, the bit line selection circuit 1230 may connect the bit lines BL to the write driver 1240. At a read operation, the bit line selection circuit 1230 may connect the bit lines BL to the sense amplifier 1250.

The write driver 1240 may operate responsive to the control of the control logic 1270. The write driver 1240 may be configured to program memory cells which are connected to bit lines selected by the bit line selection circuit 1230 and to a word line selected by the address decoder 1220. The write driver 1240 may generate a set current or a reset current according to data received from the data input/output circuit, and may output the set current or the reset current to the selected bit lines.

The sense amplifier 1250 may operate responsive to the control of the control logic 1270. The sense amplifier 1250 may be configured to read memory cells which are connected to bit lines selected by the bit line selection circuit 1230 and to a word line selected by the address decoder 1220. The sense amplifier 1250 may read the memory cells by sensing currents flowing through the selected bit lines or voltages of the selected bit lines. The sense amplifier 1250 may output the read data to the data input/output circuit 1260.

The data I/O circuit 1260 may operate responsive to the control of the control logic 1270. The data input/output circuit 1260 may transfer externally received data to the write driver 1240 and output data provided from the sense amplifier 1250 to an external device.

The control logic 1270 may control an overall operation of the phase change memory 1200. The control logic 1270 may operate responsive to a command CMD and a control signal CTRL received from the external device.

The NVRAM 1200 may provide the random access function. A physical address system of the NVRAM 1200 may be equal to a logical address system of an external host. Thus, a controller 1300 in FIG. 1 may not necessitate a device for translating a logical address of the external host into a physical address of the phase change memory 1200.

Figure 10:
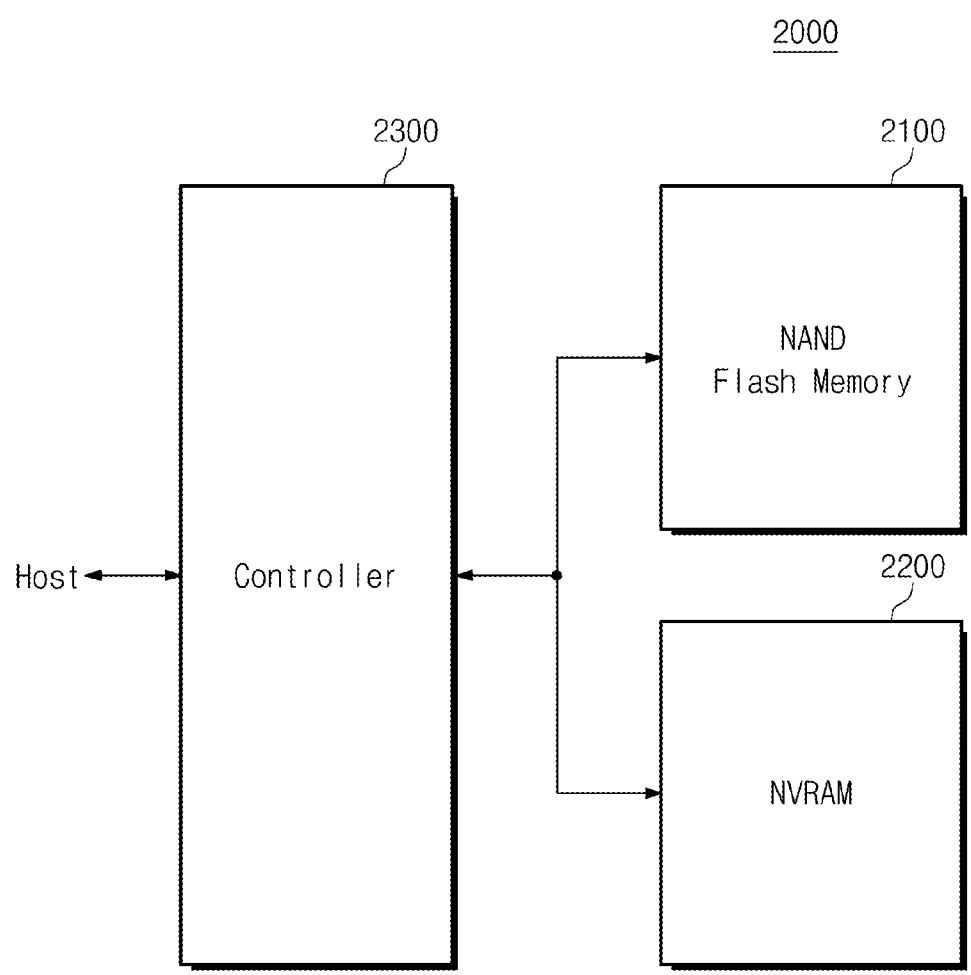
FIG. 10 is a block diagram illustrating a memory system according to another embodiment of the inventive concept.

FIG. 10 is a general block diagram illustrating a memory system according to another embodiment of the inventive concept. Referring to FIG. 10, a memory system 2000 comprises a NAND flash memory 2100, a nonvolatile random access memory (NVRAM) 2200, and a controller 2300. Compared with a memory system 1000 in FIG. 1, the controller 2300 may control the NAND flash memory 2100 and the NVRAM 2200 via a common bus. The NAND flash memory 2100 and the NVRAM 2200 may communicate with the controller 2300 in a time division manner.

Figure 11:
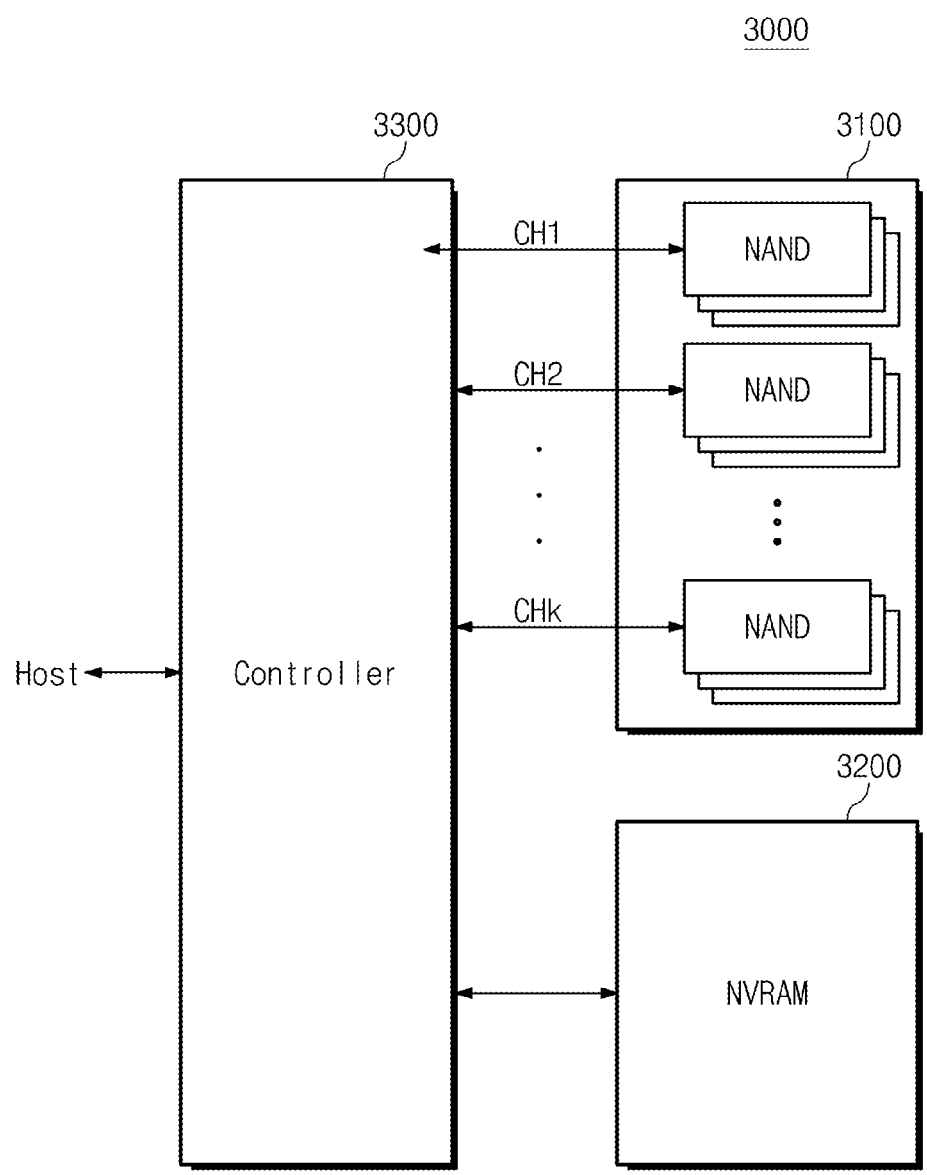
FIG. 11 is a block diagram illustrating a memory system according to still another embodiment of the inventive concept.

FIG. 11 is a block diagram illustrating a memory system according to still another embodiment of the inventive concept. Referring to FIG. 11, a memory system 3000 may include a NAND flash memory 3100, a nonvolatile random access memory (NVRAM) 3200, and a controller 3300. Compared with a memory system 1000 in FIG. 1, the NAND flash memory 3100 may communicate with the controller 3300 via a plurality of channels CH1 to CHk. Each channel may be connected with a plurality of NAND flash memory chips.

In example embodiments, as described with reference to FIG. 10, the NAND flash memory 3100 and the controller 3300 may be connected to a common bus, and the plurality of channels CH1 to CHk may occupy the common bus in a time division manner.

In example embodiments, as described with reference to FIG. 10, the NAND flash memory 3100 and the NVRAM 3200 may be connected to the controller 3300 via the common bus, and may communication with the controller 3300 in a time division manner.

Figure 12:
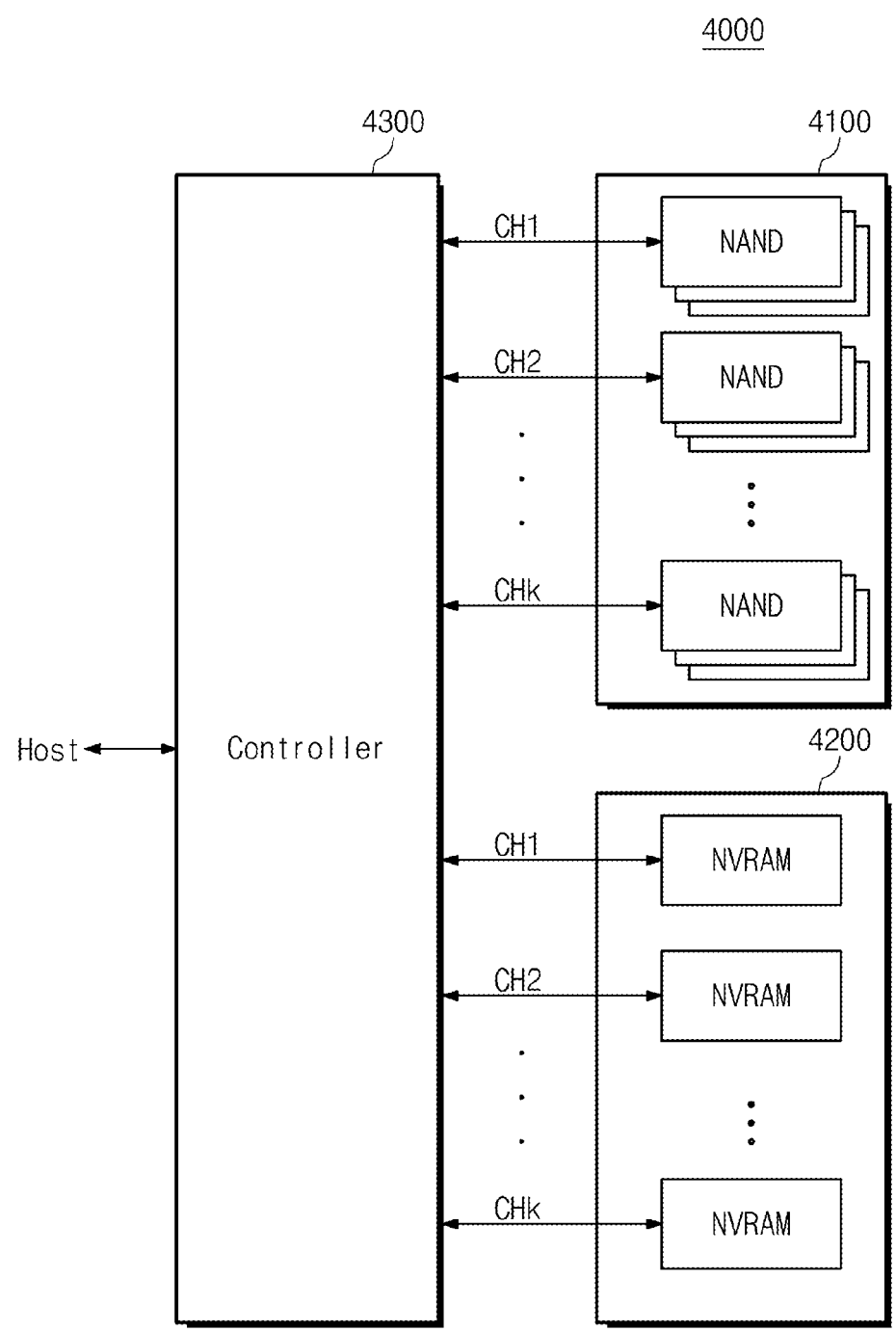
FIG. 12 is a block diagram illustrating a memory system according to still another embodiment of the inventive concept.

FIG. 12 is a block diagram illustrating a memory system according to still another embodiment of the inventive concept. Referring to FIG. 12, a memory system 4000 comprises a NAND flash memory 4100, a nonvolatile random access memory (NVRAM) 4200, and a controller 4300. Compared with a memory system 1000 in FIG. 1, the NAND flash memory 4100 may communicate with the controller 4300 via a plurality of channels CH1 to CHk. Each channel may be connected with a plurality of NAND flash memory chips. The NVRAM 4200 may communicate with the controller 4300 via a plurality of channels CH1 to CHk. Each channel may be connected with a plurality of NVRAM chips.

The NVRAM chips connected with one channel may correspond to NAND flash memory chips connected with one channel, respectively. Pass information associated with NAND flash memory chips connected with one channel may be programmed at a corresponding nonvolatile random access memory chip.

In example embodiments, as described with reference to FIG. 10, the NAND flash memory 4100 and the controller 4300 may be connected to a common bus, and the plurality of channels CH1 to CHk may occupy the common bus in a time division manner.

In example embodiments, as described with reference to FIG. 10, the NAND flash memory 4100 and the NVRAM 4200 may be connected to the controller 4300 via the common bus, and may communication with the controller 4300 in a time division manner.

Figure 13:
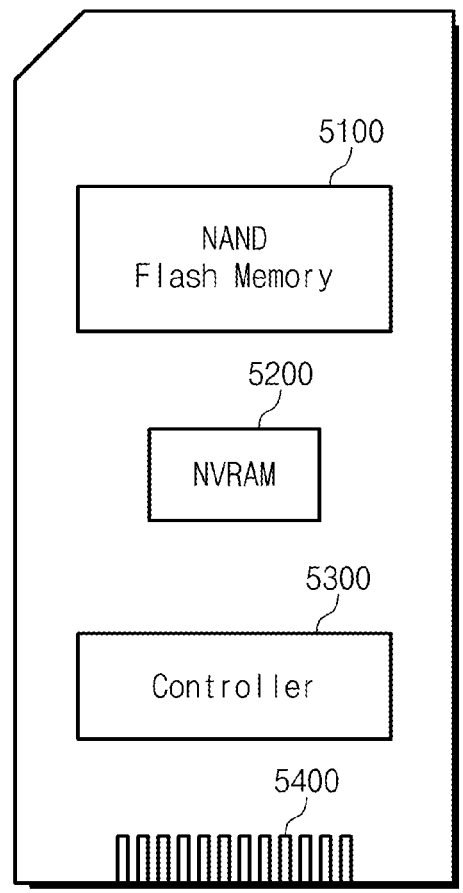
FIG. 13 is a block diagram illustrating a memory card according to an embodiment of the inventive concept.

FIG. 13 is a block diagram illustrating a memory card according to an embodiment of the inventive concept. Referring to FIG. 13, a memory card 5000 comprises a NAND flash memory 5100, a nonvolatile random access memory (NVRAM) 5200, a controller 5300, and a connector 5400.

The controller 5300 may store pass information associated with the NAND flash memory 5100 in the NVRAM 5200.

The memory card 5000 may be formed of memory cards such as a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, and so on.

Figure 14:
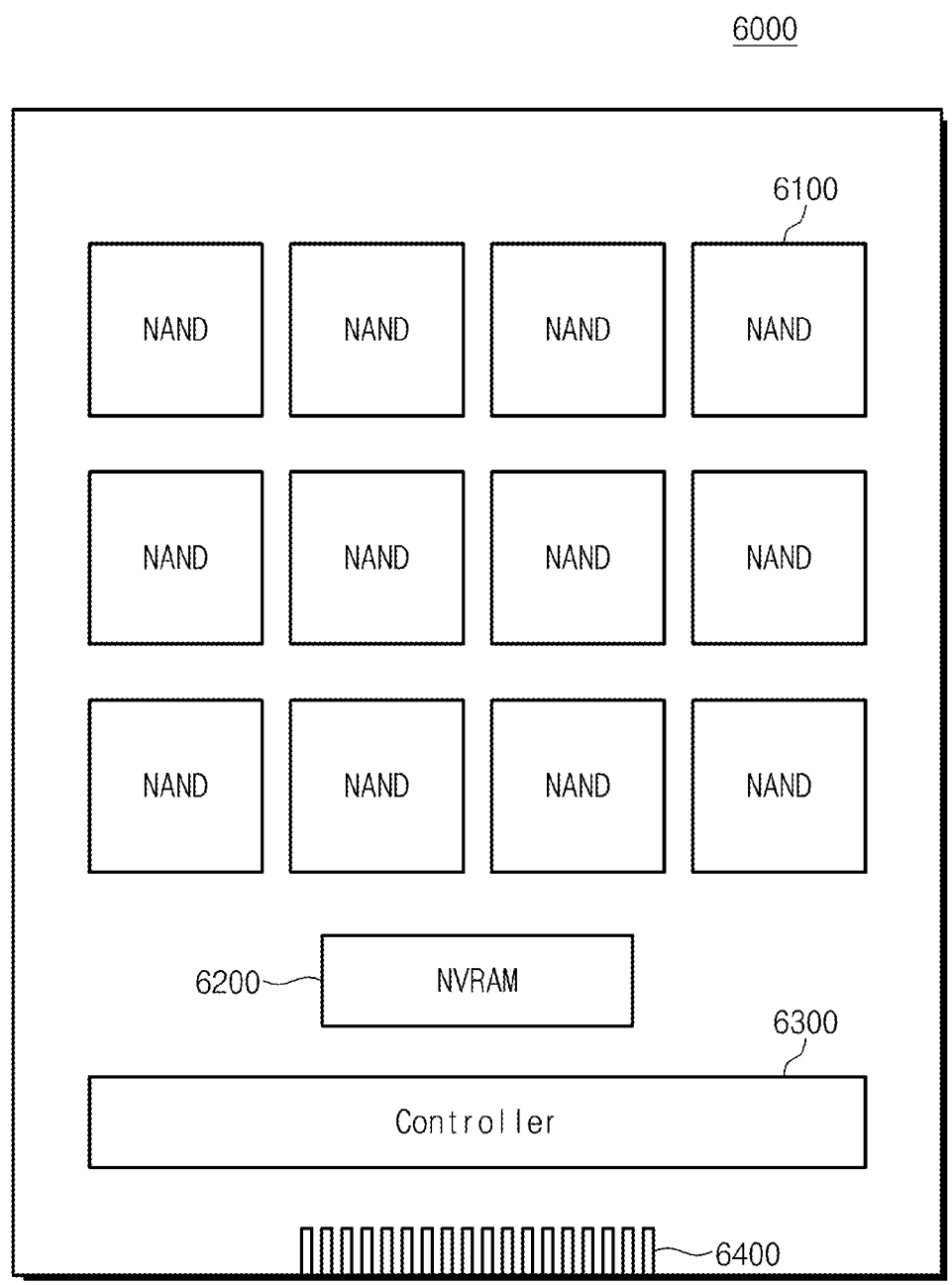
FIG. 14 is a block diagram illustrating a solid state drive according to an embodiment of the inventive concept.

FIG. 14 is a block diagram illustrating a solid state drive according to an embodiment of the inventive concept. Referring to FIG. 14, a solid state drive 6000 comprises a plurality of NAND flash memories 6100, a nonvolatile random access memory (NVRAM) 6200, a controller 6300, and a connector 6400.

The controller 6300 may store pass information associated with the NAND flash memory 6100 in the NVRAM 6200.

Figure 15:
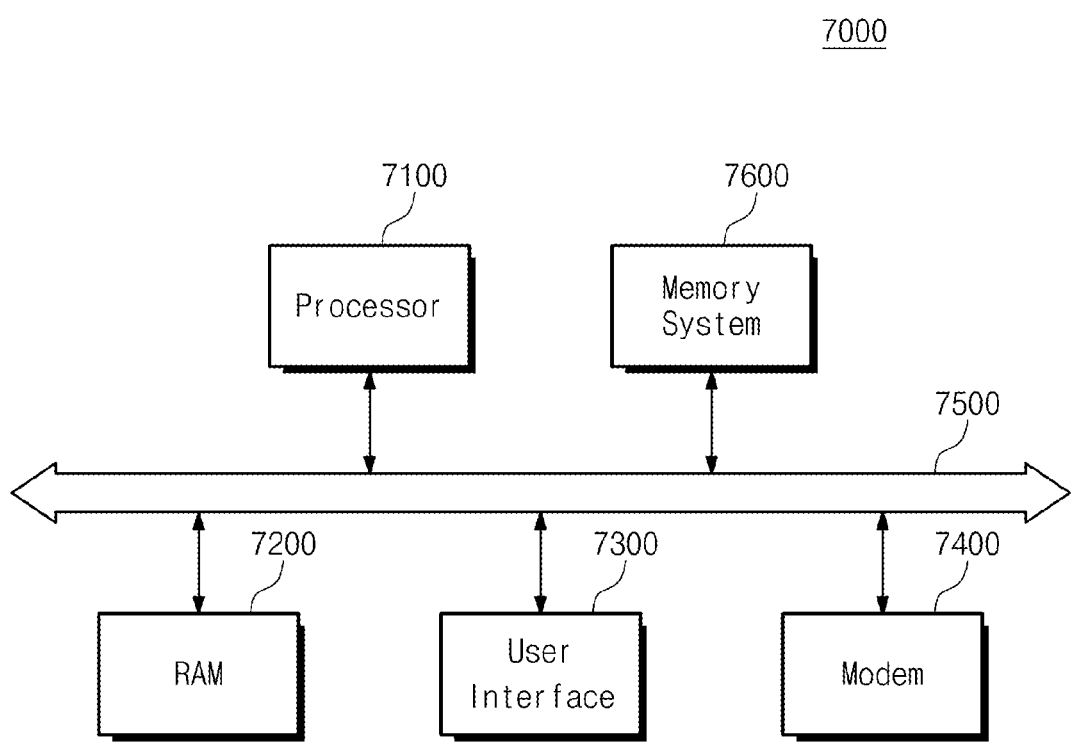
FIG. 15 is a block diagram illustrating a computational system according to an embodiment of the inventive concept.

FIG. 15 is a block diagram illustrating a computational system according to an embodiment of the inventive concept. Referring to FIG. 15, a computational system 7000 comprises a central processing unit 7100, a volatile RAM 7200, a user interface 7300, a modem 7400, a system bus 7500, and a memory system 7600.

The memory system 7600 may be connected electrically with the elements 7100 to 7400 via the system bus 7500. Data provided via the user interface 7300, data processed by the central processing unit 7100, or data received through the modem 7400 may be stored in the memory system 7600.

The memory system 7600 may be one of memory systems 1000 to 4000 described with reference to FIGS. 1 and 10 to 12.

While the inventive concept has been described with reference to exemplary embodiments, it will be apparent to those skilled in the art that various changes and modifications may be made without departing from the scope of the following claims. Therefore, it should be understood that the above embodiments are illustrative in nature.

What is claimed is:

1. An operating method for a memory system including a nonvolatile random access memory (NVRAM) and a NAND flash memory, the method comprising:

receiving a read request directed to a target memory cell of the NAND flash memory;

performing a normal read operation directed to the target memory cell in response to the read request; and then, determining that a read fail has occurred as a result of the normal read operation; and then in response to the read fail, performing a read retry operation by iterations directed to the target memory cell according to a first read retry scheme until a pass read retry iteration successfully reads the target memory cell; and then, storing pass information associated with the pass read retry iteration in the NVRAM, wherein the method further comprises:

further in response to the read fail and before performing the read retry operation by iterations directed to the target memory cell, reading pass information related to the read request previously stored in the NVRAM, wherein the first read retry scheme is defined at least in part by the pass information read from the NVRAM;

determining whether a number of program/erase (P/E) cycles for the target memory cell has reached a reference value; and upon determining that the number of P/E cycles for the target memory cell has not reached the reference value, performing the read retry operation by iterations directed to the target memory cell according to a second read retry scheme different from the first read retry scheme until a pass read retry iteration successfully reads the target memory cell, instead of reading the pass information related to the read request previously stored from the NVRAM and performing the read retry operation by iterations directed to the target memory cell according to the first read retry scheme until the pass read retry iteration successfully reads the target memory cell.

2. The operating method of claim 1, wherein the pass information comprises information related to at least one level for a read voltage used during the read retry operation as defined by the first read retry scheme.

3. The operating method of claim 2, wherein the pass information further comprises at least one bit error rate for the read retry operation as iteratively performed using the at least one level of the read voltage.

4. The operating method of claim 2, wherein the pass information comprises a number of P/E cycles for the target memory cell once the pass read retry iteration successfully reads the target memory cell.

5. The operating method of claim 1, wherein the pass information comprises information related to at least one level for a read voltage used during the read retry operation as defined by the second read retry scheme.

6. The operating method of claim 5, wherein the pass information further comprises at least one bit error rate for the read retry operation as iteratively performed using the at least one level of the read voltage.

7. The operating method of claim 5, wherein the pass information comprises a number of P/E cycles for the target memory cell once the pass read retry iteration successfully reads the target memory cell.

8. The operating method of claim 1, wherein the pass information comprises information characterizing a minima valley existing between adjacent, overlapping threshold voltage distributions for the target memory cell.

9. An operating method for a memory system including a nonvolatile random access memory (NVRAM) and a NAND flash memory, the method comprising:
   receiving a read request directed to a target memory cell of the NAND flash memory;
   determining whether a number of program/erase (P/E) cycles for the target memory cell has reached a reference value; and
   (A) upon determining that the number of P/E cycles for the target memory cell has not reached the reference value, performing a first normal read operation with default voltages directed to the target memory cell; else
   (B) upon determining that the number of P/E cycles for the target memory cell has reached the reference value, reading pass information related to the read request previously stored in the NVRAM, and performing a second normal read operation with adjusted voltages by read pass information directed to the target memory cell; and then,
   determining that a read fail has occurred as a result of the first or second normal read operation; and then in response to the read fail,
   performing a read retry operation by iterations directed to the target memory cell until a pass read retry iteration successfully reads the target memory cell; and then,
   storing updated pass information associated with the pass read retry iteration in the NVRAM.

10. The operating method of claim 9, wherein the pass information comprises information related to at least one level for a read voltage used during the read retry operation.

11. The operating method of claim 10, wherein the pass information further comprises at least one bit error rate for the read retry operation as iteratively performed using the at least one level of the read voltage.

12. The operating method of claim 10, wherein the pass information comprises a number of P/E cycles for the target memory cell once the pass read retry iteration successfully reads the target memory cell.

13. An operating method for a memory system including a nonvolatile random access memory (NVRAM) and a NAND flash memory, the method comprising:
   receiving a read request directed to a target memory cell of the NAND flash memory;
   performing a normal read operation directed to the target memory cell in response to the read request; and then,
   determining that a read fail has occurred as a result of the normal read operation; and then in response to the read fail,
   iteratively performing read operations using different read voltages;
   making a soft decision regarding a programmed state of the target memory cell in relation to read results of the read operations; and
   storing pass information related to the soft decision in the NVRAM.

14. The operating method of claim 13, further comprising:
   further in response to the read fail and before performing iteratively performing the read operation, reading pass information related to the read request previously stored in the NVRAM.

15. The operating method of claim 14, wherein the read operation is defined at least in part by the pass information read from the NVRAM.

16. The operating method of claim 13, wherein the pass information comprises information related to the different read voltages used during the read operation in relation to the soft decision succeeded.

17. The operating method of claim 16, wherein the pass information further comprises at least one bit error rate for the read operation.

18. The operating method of claim 16, wherein the pass information comprises a number of P/E cycles for the target memory cell once the soft decision is made.

* * * * *